United States Patent
Goetz et al.

(10) Patent No.: US 6,744,336 B1
(45) Date of Patent: Jun. 1, 2004

(54) WAFER-SCALE PACKAGE FOR SURFACE ACOUSTIC WAVE CIRCUIT AND METHOD OF MANUFACTURING THE SAME

(75) Inventors: Martin Goetz, Dallas, TX (US); Sarah Schwab, Dallas, TX (US)

(73) Assignee: Clarisay, Incorporated, Dallas, TX (US)

( * ) Notice: Subject to any disclaimer, the term of this patent is extended or adjusted under 35 U.S.C. 154(b) by 0 days.

(21) Appl. No.: 10/271,392

(22) Filed: Oct. 15, 2002

Related U.S. Application Data

(63) Continuation-in-part of application No. 09/821,592, filed on Mar. 29, 2001.

(51) Int. Cl.[7] .................................................. H03H 9/64
(52) U.S. Cl. ................... 333/193; 333/195; 310/313 B; 29/25.35
(58) Field of Search .................. 333/193–196; 310/313 R, 313 B, 313 C, 313 D; 29/25.35

(56) References Cited

U.S. PATENT DOCUMENTS

| | | | | |
|---|---|---|---|---|
| 5,119,172 A | * | 6/1992 | Cho et al. | 257/684 |
| 5,215,546 A | * | 6/1993 | Cho et al. | 29/25.01 |
| 5,726,610 A | * | 3/1998 | Allen et al. | 333/133 |
| 6,078,229 A | * | 6/2000 | Funada et al. | 333/193 |
| 6,185,801 B1 | * | 2/2001 | Kadota et al. | 29/25.35 |
| 6,246,148 B1 | * | 6/2001 | Flowers et al. | 310/313 B |
| 6,287,894 B1 | * | 9/2001 | Sawin | 438/113 |

FOREIGN PATENT DOCUMENTS

| | | | | |
|---|---|---|---|---|
| JP | 1-218116 | * | 8/1989 | 333/193 |
| JP | 3-160811 | * | 7/1991 | 310/313 A |
| JP | 5-275963 | * | 10/1993 | 333/193 |
| JP | 5-275964 | * | 10/1993 | 333/193 |
| JP | 6-132760 | * | 5/1994 | 29/25.35 |

OTHER PUBLICATIONS

Jean Phalippou; "Sol–Gel: A Low Temperature Process for the Materials of the New Millennium"; www.solgel.com; Jun. 2000.

* cited by examiner

*Primary Examiner*—Barbara Summons

(57) ABSTRACT

A surface acoustic wave (SAW) circuit package and a method of fabricating the package. In one embodiment, the package includes: (1) a substantially planar piezoelectric substrate, (2) SAW circuit conductors located over the substrate and (3) a passivation layer located over the SAW circuit conductors, the substrate and the passivation layer cooperating to form a hermetic seal to isolate the SAW circuit conductors from an environment proximate the package.

20 Claims, 6 Drawing Sheets

WAFER-SCALE PACKAGE FOR SURFACE ACOUSTIC WAVE CIRCUIT AND METHOD OF MANUFACTURING THE SAME

CROSS-REFERENCE TO RELATED APPLICATIONS

This application is a continuation-in-part of U.S. patent application Ser. No. 09/821,592, entitled "WAFER-SCALE PACKAGE FOR SURFACE ACOUSTIC WAVE CIRCUIT AND METHOD OF MANUFACTURING THE SAME, filed on Mar. 29, 2001. The above-listed application is commonly assigned with the present invention and is incorporated herein by reference as if reproduced herein in its entirety.

TECHNICAL FIELD OF THE INVENTION

The present invention is directed, in general, to surface acoustic wave (SAW) circuits and, more specifically, to a wafer-scale package for a SAW circuit and method of manufacturing such wafer-scale package therefor.

BACKGROUND OF THE INVENTION

Surface acoustic wave (SAW) devices for use in electronic signal processing have been advantageously adopted by the electronics industry. Such SAW devices have several advantages over more conventional technologies. They can be designed to provide complex signal processing in a single unit, and they also offer an additional benefit, which is their ability to be mass produced using semiconductor microfabrication techniques. These techniques lead to lower-cost devices, having only small operating characteristic variations from unit to unit. Since SAW devices may be implemented in rugged, light-weight and power-efficient modules, they find many important applications, especially in mobile, wireless and spaceborne communication systems. Such communication systems typically operate over a wide range of frequencies from about 10 megahertz to about two gigahertz. The specific signal processing capabilities and frequency range of SAW devices may be customized to allow SAW devices to perform several roles in electronic systems.

An important feature of the SAW device is its geometry, which incorporates two metal patterns having interdigitated conductive lines or traces. Such interdigitated metal structures are formed on a piezoelectric substrate and act as input and output signal paths when an AC signal voltage is applied to one of the metal structures. This AC voltage induces a surface acoustic wave in the underlying substrate wherein the acoustic wave propagates to the output structure. The interdigitated metal lines of the signal receiving portion detect the acoustic wave and convert it into a filtered electrical output signal. SAW devices, operating in the Rayleigh wave mode, can generally be designed to provide bandpass filters that achieve responses, which would otherwise require several hundred inductors and capacitors in conventional LC filter designs. Proper operation and containment of the acoustic waves require precise construction of both the central and outlying regions.

Turning briefly to FIG. 1, illustrated is a diagram of a conventional packaged SAW device 100. As illustrated, the packaged SAW device 100 includes interdigitated metal structures 110 and a piezoelectric substrate 120, both of which are manufactured on a wafer substrate 130. Formed over the interdigitated metal structures 110 and the piezoelectric substrate 120, and contacting the wafer substrate 130, is a hermetic enclosure 140. It is common for the hermetic enclosure 140 to have a substantially larger footprint than the footprint of the piezoelectric substrate 120. An aspect ratio of 6 to 1, representing a ratio of the footprint of the hermetic enclosure to the footprint of the piezoelectric substrate, is not uncommon in today's electronics industry. Packaging the Prior Art SAW devices 100 as shown in FIG. 1 has become well accepted, unfortunately, the outermost footprint of the packaged SAW device 100 is larger than currently desired in the electronics industry, particularly the wireless telephone industry.

Accordingly, what is needed in the art is a method of packaging SAW devices that does not experience the space limitations experienced in the prior art methods.

SUMMARY OF THE INVENTION

To address the above-discussed deficiencies of the prior art, the present invention provides a SAW circuit package and a method of fabricating the package. In one embodiment, the package includes: (1) a substantially planar piezoelectric substrate, (2) SAW circuit conductors located over the substrate, (3) a passivation layer located over the SAW circuit conductors, and (4) a layer of mass loading material located between the saw circuit conductors and the passivation layer, the substrate, the layer of mass loading material and the passivation layer cooperating to form a hermetic seal to isolate the SAW circuit conductors from an environment proximate the package.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

Prior Art

DETAILED DESCRIPTION

Figure 1:
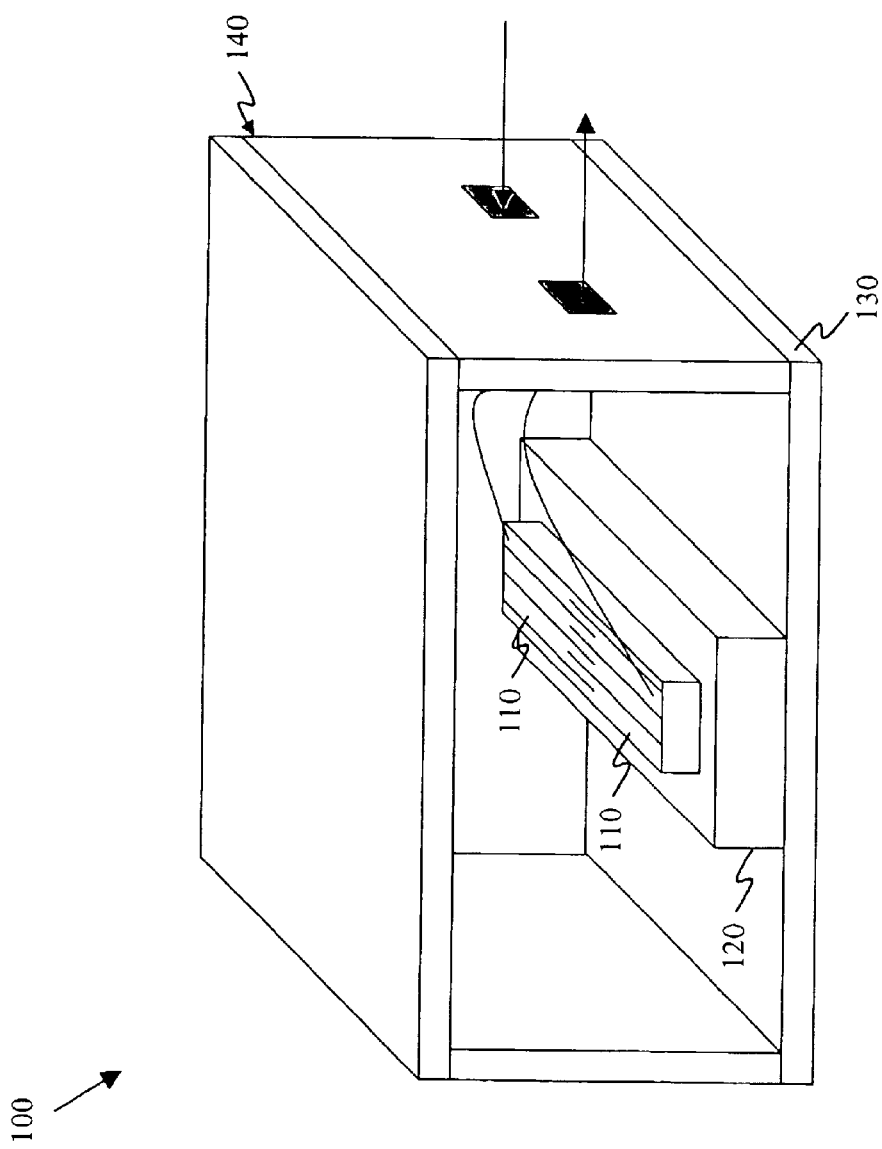
FIG. 1 illustrates a diagram of a conventional packaged SAW device.
Figure 2:
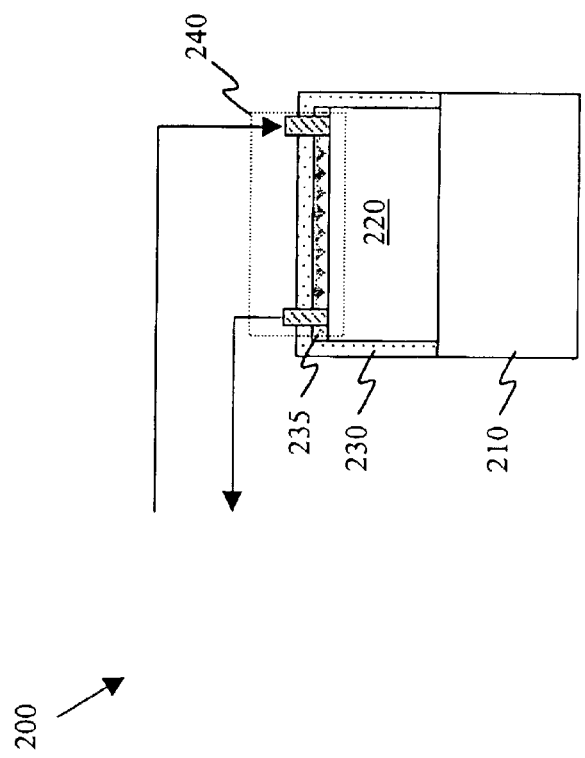
FIG. 2 illustrates a block diagram of a surface acoustic wave (SAW) circuit package constructed according to the principles of the present invention.

Referring initially to FIG. 2, illustrated is a block diagram of a surface acoustic wave (SAW) circuit package 200 constructed according to the principles of the present invention. The SAW circuit package 200 includes a substantially planar piezoelectric substrate 210, and SAW circuit conductors 220 located over the substrate 210. The SAW circuit package 200 further includes a passivation layer 230 located over the SAW circuit conductors 220. Additionally, the SAW circuit package 200 includes a layer of mass loading material 235 located between the SAW circuit conductors 220 and the passivation layer 230. As illustrated, the substantially planar piezoelectric substrate 210, the layer of mass loading material 235, and the passivation layer 230 cooperate to form a hermetic seal Lo isolate the SAW circuit conductors 220. Thus, the hermetic seal advantageously isolates the SAW circuit conductors 220 from environmental contaminants and damage that might harm their operation. In the embodiment shown in FIG. 2, the SAW circuit package 200 further contains a plurality of vias 240 containing metal, wherein the vias 240 contact the SAW circuit conductors 220 to form terminals.

In contrast to prior art SAW devices, the SAW circuit package 200 uses the layer of mass loading material 235 between the passivation layer 230 and the SAW circuit conductors 220. Since the layer of mass loading material 235 may be formed directly on the SAW circuit conductors 220, with the passivation layer 230 located thereover, much of the space that typically resides between the SAW circuit conductors 220 and the traditional hermetic enclosure, is substantially eliminated. The layer of mass loading material 235, in contrast to various other layers of material, does not substantially effect the function or performance of the SAW circuit conductors when formed thereon.

Figure 3:
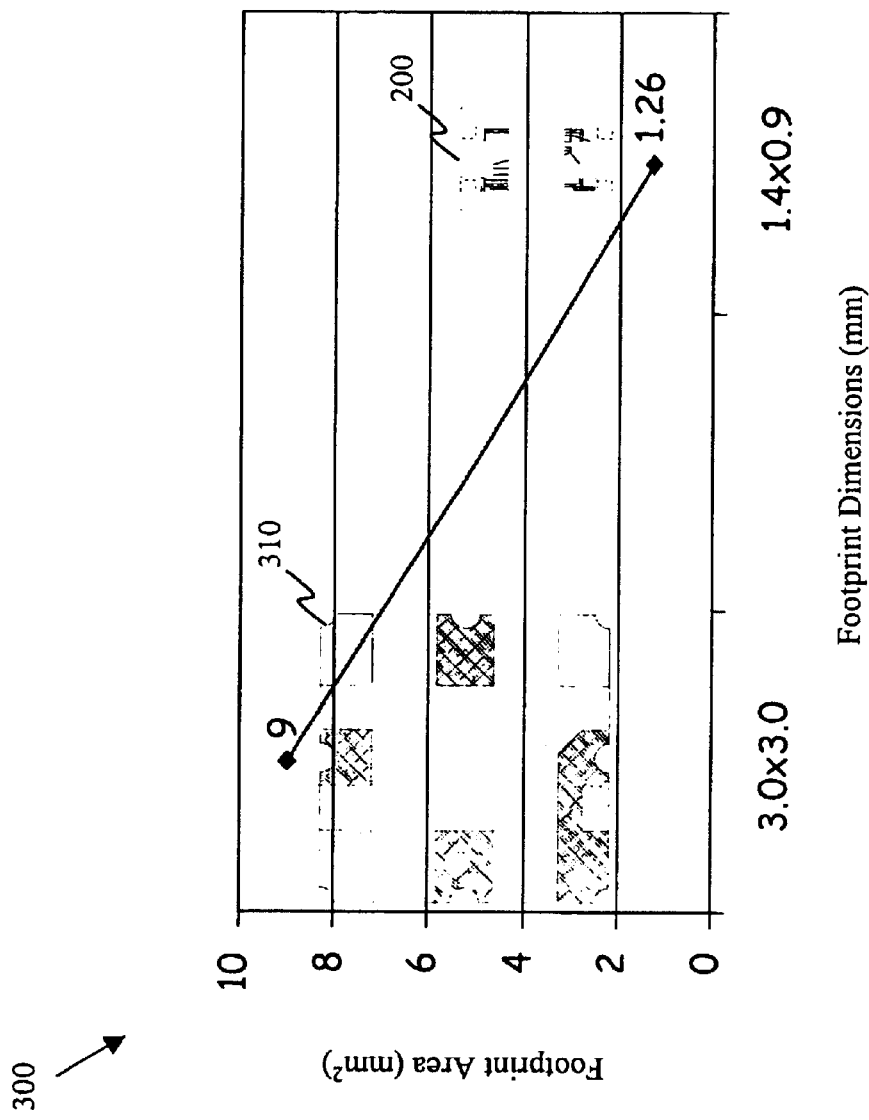
FIG. 3 illustrates a graph showing a decrease in footprint area that may be achieved using the principles of the present invention.

Turning briefly to FIG. 3, shown is an illustration 300 depicting an average footprint area of a Prior Art SAW device 310 as compared to a footprint area of one embodiment of the SAW circuit package 200. As illustrated, the Prior Art SAW device 310 might have footprint dimensions of 3 mm×3 mm, resulting in a footprint area of about 9 mm$^2$. In contrast, the SAW circuit package 200, in one particular embodiment, might have footprint dimensions of about 1.4 mm×0.9 mm, resulting in a SAW circuit package 200 footprint area of about 1.26 mm$^2$. Thus, as one skilled in the art may conclude, using the passivation layer 230 allows for a reduction in footprint area, which in the particular embodiment, may be up to about 700 percent.

Figure 4:
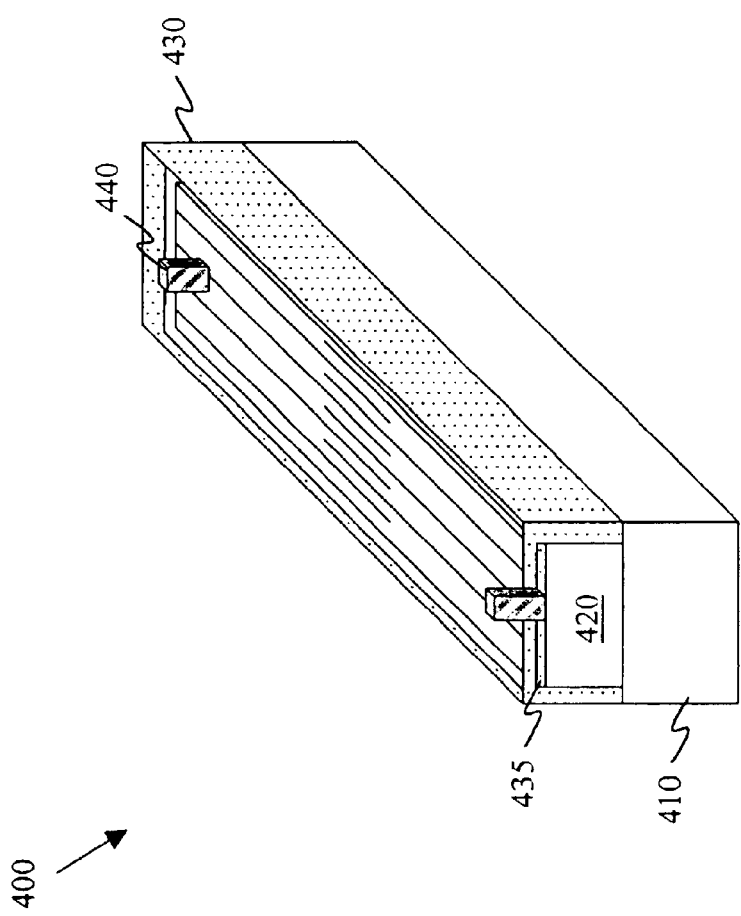
FIG. 4 illustrates a diagram of an embodiment of a SAW circuit package constructed according to the principles of the present invention.

Turning now to FIG. 4, illustrated is a diagram of an embodiment of a SAW circuit package 400 constructed according to the principles of the present invention. The SAW circuit package 400 includes a substantially planar piezoelectric substrate 410 having SAW circuit conductors 420, collectively acting as a SAW resonator, formed thereover. The substantially planar piezoelectric substrate 410 may comprise many known or hereinafter discovered piezoelectric materials, however, in one advantageous embodiment of the present invention, the substantially planar piezoelectric substrate 410 comprises a material selected from the group consisting of bismuth germanium oxide, gallium arsenide, lithium borate, lithium niobate, lithium tantalate, langasite, lead zirconium tantalate, or quartz.

As illustrated in FIG. 4, the SAW circuit package 400 further includes a layer of mass loading material 435 formed over the SAW circuit conductors 420. The layer of mass loading material 435, in an exemplary embodiment, is formed over the entire surface of the SAW circuit conductors 420. For clarity in understanding the SAW circuit conductors 420, however, a portion of the layer of mass loading material 435 is shown as transparent.

The layer of mass loading material 435 may comprise any one of a variety of materials. In one particularly advantageous embodiment of the present invention, the layer of mass loading material 435 comprises an aerogel or a xerogel material. Other mass loading materials 435 are, however, within the broad scope of the present invention. For example, a silica material having a particle size ranging from about 0.002 $\mu$m to about 0.1 $\mu$m could be used. In a preferred embodiment, the particle size approximates 0.02 $\mu$m.

In the particular embodiment shown in FIG. 4, the layer of mass loading material 435 has a thickness ranging from about 0.1 $\mu$m to about 2.0 $\mu$m, with a preferred thickness ranging from about 0.5 $\mu$m to about 1.5 $\mu$m. While the layer of mass loading material 435 may have a variety of thicknesses, one embodiment of the invention requires that it be thick enough to completely fill a cavity created by the passivation layer 430.

Those skilled in the art understand the various methods that could be used to manufacture the layer of mass loading material 435. It has been found that thin (about 0.1 $\mu$m), uniform and crack-free films can be readily formed on various materials by dip, spin, or spray coating. Further, thicker layers may be obtained by multiple coatings. Additional information regarding various aspects of the mass loading material and its method of manufacture, may be found in an article entitled "SOL-GEL: A LOW TEMPERATURE PROCESS FOR THE MATERIALS OF THE NEW MILLENNIUM", by Jean Phalippou (May 2000), which has been incorporated in its entirety herein by reference.

As illustrated in FIG. 4, the SAW circuit package 400 further includes a passivation layer 430 formed over the SAW circuit conductors 420 and the layer of mass loading material 435. The passivation layer 430 is formed over the entire surface of the SAW circuit conductors 420, however, for clarity in understanding the SAW circuit conductors 420, a portion of the passivation layer 430 is shown as transparent. In the embodiment illustrated in FIG. 4, the passivation layer 430 and the substantially planar piezoelectric substrate 410 cooperate to form a hermetic seal. As illustrated in FIG. 4, footprints of the substantially planar piezoelectric substrate 410 and the passivation layer 430, are substantially coextensive. This allows the SAW circuit package 400 to occupy no more circuit board "real estate" than the bare substantially planar piezoelectric substrate 410 itself. This provides an important advantage over the prior art SAW devices, especially in view of the electronic industries' move toward more compact devices.

The passivation layer 430 may comprise any known or hereafter discovered layer that may provide a hermetic seal. In one particularly advantageous embodiment of the present invention, the passivation layer 430 comprises a material selected from the group consisting of Silicon Carbide, Silicon Dioxide and Silicon Nitride, however, many other materials are within the scope of the present invention. Additionally, the passivation layer may be formed, possibly using a plasma enhanced chemical vapor deposition (PECVD) or other similar process, to a thickness ranging from about 250 nm to about 1200 nm. It should be noted, however, that the present invention should not be limited to the above-mentioned thicknesses, and that many other thicknesses may be used.

In the embodiment illustrated in FIG. 4, the SAW circuit package 400 further includes a plurality of vias 440 formed within the passivation layer 430. The vias 440 contact the SAW circuit conductors 420, forming terminals therefor. In an exemplary embodiment of the invention, the vias 440 comprise a conductive metal, such as aluminum, copper, gold or any other known or hereinafter discovered conductive material. The vias 440 may be formed within the passivation layer 430 after formation thereof. In such an instance, it would be critical that the vias 440 be designed and formed, such that a substantial hermetic enclosure is maintained. While not shown, the passivation layer 430 may further contain other devices located thereon, such as surface mount pads, which may be used to contact the vias 440.

Figure 5:
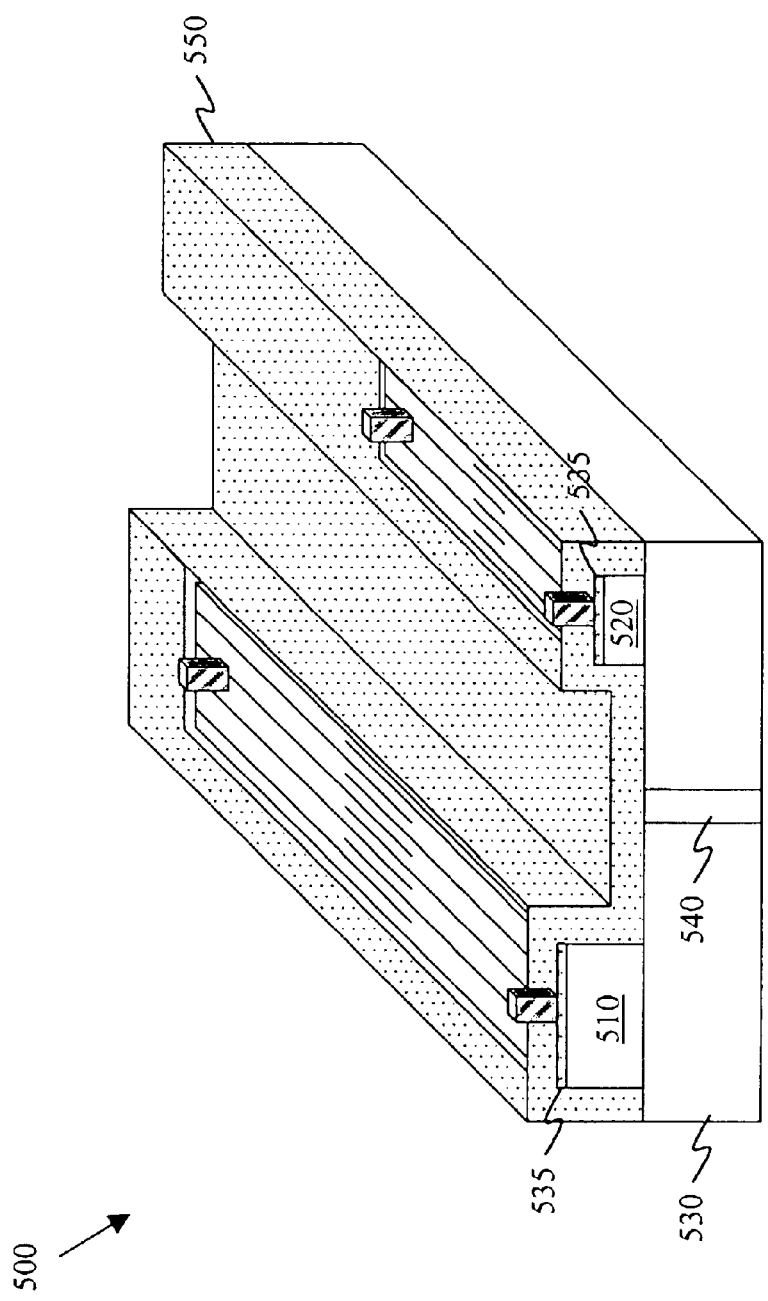
FIG. 5 illustrates a sectioned view of a SAW circuit package showing an alternative embodiment of the present invention.

Turning now to FIG. 5, illustrated is a sectioned view of a SAW circuit package 500 showing an alternative embodiment of the present invention. Similar to FIG. 4, a portion of the passivation layer is shown as transparent. The embodiment of the SAW circuit package 500 illustrated in FIG. 5 includes a first set of SAW circuit conductors 510 and a second set of SAW circuit conductors 520, both of which are formed over a common substantially planar piezoelectric substrate 530. As illustrated, the common piezoelectric substrate 530 includes a crosstalk shield 540 located therein, and between the first and second sets of SAW circuit conductors 510, 520. The crosstalk shield 540 provides a signal isolation barrier between the first and second sets of SAW circuits conductors 510, 520. The crosstalk shield 540 prevents signals within each of the first and second sets of SAW circuits conductors 510, 520 from interfering with the other, since they are in close proximity and share the substantially planar common piezoelectric substrate 530. In an exemplary embodiment, the signal isolation is achieved by connecting the crosstalk shield 540 to ground.

As further illustrated in FIG. 5, a passivation layer 550 may be formed over the first and second sets of SAW circuits conductors 510, 520, forming a hermetic seal therefore. Likewise, a layer of mass loading material 535 may be located between the saw circuit conductors 510, 520, and the passivation layer 550. Similar to the embodiment illustrated in FIG. 4, a plurality of vias 560 may be formed in the passivation layer 550, providing electrical connection to the first and second sets of SAW circuit conductors 510, 520.

Figure 6:
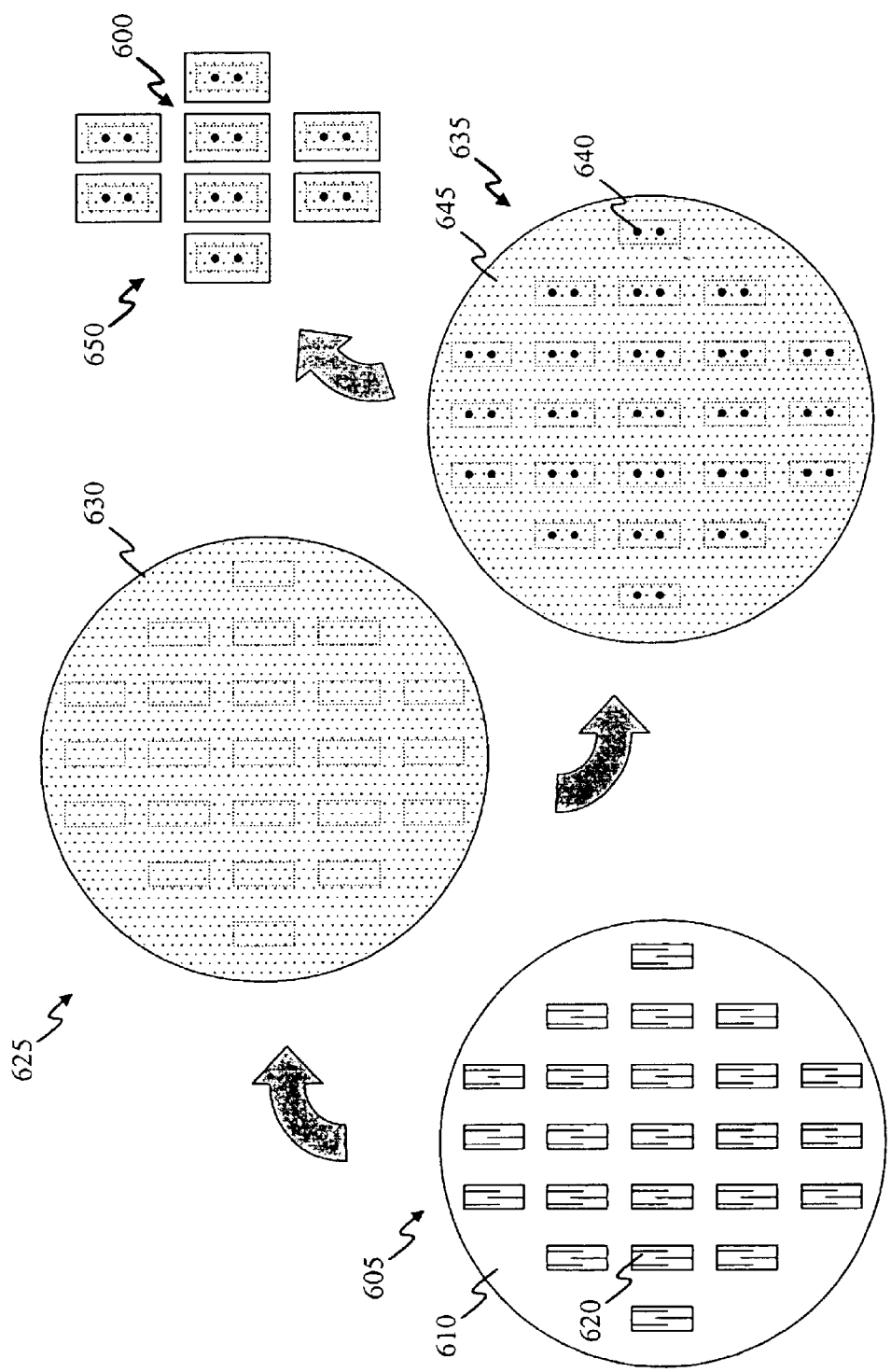
FIG. 6 illustrates a method of manufacturing an embodiment of a SAW circuit package, which in the present embodiment may be similar to the SAW circuit package illustrated in FIG. 4.

Turning to FIG. 6, illustrated is a method of manufacturing an embodiment of a SAW circuit package 600, which in the present embodiment may be similar to the SAW circuit package 400 illustrated in FIG. 4. In a first manufacturing step 605, a substantially planar piezoelectric wafer 610, such as a 4-inch piezoelectric wafer, is provided. The substantially planar piezoelectric water 610 may comprise many known or hereinafter discovered piezoelectric materials, however, in one advantageous embodiment of the present invention, the substantially planar piezoelectric wafer 610 comprises a material selected from the group consisting of bismuth germanium oxide, gallium arsenide, lithium borate, lithium niobate, lithium tantalate, langasite, lead zirconium tantalate, or quartz.

Subsequent to providing the substantially planar piezoelectric wafer 610, a plurality of SAW circuit conductors may be formed over the substantially planar piezoelectric wafer 610, forming a plurality of SAW resonators 620. In certain circumstances, a subsequently formed passivation layer substantially alters an electrical characteristic of the SAW resonators 620. This may be a result of the passivation layer being formed directly on the SAW resonators 620, and preventing the SAW resonators 620 from operating as if no passivation layer were formed thereon. Thus, in one particular embodiment of the invention, tolerances, which compensate for the passivation layer being formed directly on the SAW resonators 620, are required to be built into the SAW resonators 620. In such an instance, modeling and characterization of the SAW resonators 620, with and without the passivation layer, may be required, such that the tolerances may be determined. The tolerances may then be manufactured into the SAW resonators 620, providing SAW resonators 620 that take into account the subsequent formation of the passivation layer thereon.

In a second manufacturing step 625, a passivation layer 630 should be formed over the SAW resonators 620. In an exemplary embodiment of the invention, the passivation layer 630 comprises a material that is non-conductive and is capable of providing a substantially hermetic seal. Two examples of such passivation materials include Silicon Carbide and Silicon Nitride. It should be noted, however, that any other known or hereafter discovered passivation material may comprise the passivation layer 630. In general, an overall passivation layer 630 thickness variation should not exceed 3%. A passivation thickness variation over this amount might detrimentally affect the SAW resonators 620 filter response. In a preferred embodiment, the overall passivation layer 630 thickness variation should not exceed 1%

In a third manufacturing step 635, vias 640 should be formed within the passivation layer 630, and contacting the individual SAW resonators 620. One skilled in the art knows how to form such vias 640. One skilled in the art further understands the many materials that may comprise the vias 640, including aluminum, copper, gold or any other known or hereinafter discovered conductive material.

In a final manufacturing step 650, the SAW wafer assembly 645 illustrated in step 635, may be separated into the individual SAW circuit packages 600. The SAW circuit packages 600 may be similar to the SAW circuit packages 400 illustrated in FIG. 4. In an exemplary embodiment, the SAW wafer assembly 545 may be separated into the individual SAW circuit packages 600 using wafer dicing, however, one skilled in the art understands that any compatible separation technique may be used.

In summary, the present invention introduces the novel concept of a SAW circuit package, wherein a passivation layer provides one surface of a hermetic enclosure. Since the present invention is capable of using the passivation layer as one surface of the hermetic enclosure, much of the space surrounding the SAW circuit conductors may be eliminated, resulting in a SAW circuit package footprint substantially smaller than a footprint of prior are SAW devices. The smaller footprint allows more SAW circuit packages to be employed in a given piece of equipment (such as a wireless telephone), or further allows a piece of equipment having the same number of SAW circuit packages to be much smaller.

Additionally, the use of the passivation layer provides an amount of thermal relief for the device. This may be particularly important for SAW duplexers, which include both a transmit and a receive filter on a single SAW chip. Not only will the passivation layer provide an amount of thermal relief, but it will also provide protection against metal and stress migration, which in turn could extend the lifetime of the device. Likewise, the use of passivation layer eliminates numerous packaging process, is low cost, and is a process that may be easily implemented within current manufacturing processes.

Although the present invention has been described in detail, those skilled in the art should understand that they can make various changes, substitutions and alterations herein without departing from the spirit and scope of the invention in its broadset form.

What is claimed is:

1. A surface acoustic wave (SAW) circuit package, comprising:

a substantially planar piezoelectric substrate;

SAW circuit conductors located over said substrate;

a passivation layer located over said SAW circuit conductors; and a mass loading material located between said saw circuit conductors and said passivation layer, said substrate, said mass loading material and said passivation layer cooperating to form a hermetic seal to isolate said SAW circuit conductors from an environment proximate said package.

2. The package as recited in claim 1 wherein said mass loading material is an aerogel or a xerogel material.

3. The package as recited in claim 1 wherein said mass loading material has a thickness ranging from about 0.1 μm to about 2.0 μm.

4. The package as recited in claim 1 wherein said mass loading material comprises a silica material having a particle size ranging from about 0.002 μm to about 0.1 μm.

5. The package as recited in claim 1 wherein said mass loading material completely fills a cavity located between said SAW circuit conductors and said passivation layer.

6. The package as recited in claim 1 wherein said passivation layer comprises one selected from the group consisting of:

Silicon Carbide,

Silicon Dioxide, and

Silicon Nitride.

7. The package as recited in claim 1 wherein said SAW circuit conductors cooperate to form multiple SAW resonators.

8. A method of manufacturing a surface acoustic wave (SAW) circuit package, comprising:

creating a substantially planar piezoelectric substrate;

forming SAW circuit conductors over said substrate;

forming a passivation layer over said SAW circuit conductors; and placing a mass loading material between said saw circuit conductors and said passivation layer, said substrate, said mass loading material and said passivation layer cooperating to form a hermetic seal to isolate said SAW circuit conductors from an environment proximate said package.

9. The method as recited in claim 8 wherein placing a mass loading material includes placing a mass loading material comprising an aerogel or a xerogel.

10. The method as recited in claim 8 wherein placing a mass loading material includes placing a mass loading material having a thickness ranging from about 0.1 μm to about 2.0 μm.

11. The method as recited in claim 8 wherein placing a mass loading material includes placing a mass loading material comprising a silica material having a particle size ranging from about 0.002 μm to about 0.1 μm.

12. The method as recited in claim 8 wherein placing a mass loading material includes completely filling a cavity located between said SAW circuit conductors and said passivation layer with said mass loading material.

13. The method as recited in claim 8 wherein said passivation layer comprises one selected from the group consisting of:

Silicon Carbide,

Silicon Dioxide, and

Silicon Nitride.

14. The method as recited in claim 8 wherein said SAW circuit conductors cooperate to form multiple SAW resonators.

15. A surface acoustic wave (SAW) circuit package, comprising:

a substantially planar piezoelectric substrate having a first footprint;

SAW circuit conductors located over said substrate;

a passivation layer located over said SAW circuit conductors and having a second footprint coextensive with said first footprint;

a mass loading material located between said saw circuit conductors and said passivation layer, said substrate, said mass loading material and said passivation layer cooperating to form a hermetic seal to isolate said SAW circuit conductors from an environment proximate said package; and a plurality of vias containing metal contacting said SAW circuit conductors to form terminals therefor.

16. The package as recited in claim 15 wherein said mass loading material is an aerogel or a xerogel material.

17. The package as recited in claim 15 wherein said mass loading material has a thickness ranging from about 0.1 μm to about 2.0 μm.

18. The package as recited in claim 15 wherein said mass loading material comprises a silica material having a particle size ranging from about 0.002 μm to about 0.1 μm.

19. The package as recited in claim 15 wherein said mass loading material completely fills a cavity located between said SAW circuit conductors and said passivation layer.

20. The package as recited in claim 15 wherein said SAW circuit conductors cooperate to form multiple SAW resonators.

* * * * *